United States Patent [19]
Shoji et al.

[11] Patent Number: 5,293,156
[45] Date of Patent: Mar. 8, 1994

[54] HAND TOOL DRIVEN BY DC BATTERY WITH MULTIPLE LEVEL BATTERY CONDITION INDICATOR

[75] Inventors: Michihiro Shoji; Kenji Fukuda, both of Tokyo, Japan

[73] Assignee: Nitto Kohki Co., Ltd., Tokyo, Japan

[21] Appl. No.: 833,154

[22] Filed: Feb. 10, 1992

[30] Foreign Application Priority Data

Feb. 15, 1991 [JP] Japan ............................ 3-006368[U]

[51] Int. Cl.$^5$ .......................................... G08B 21/00
[52] U.S. Cl. .................................. 340/636; 340/661; 340/691; 320/48; 324/433
[58] Field of Search ............... 340/635, 636, 660, 661, 340/662, 691; 320/48, 2; 324/425, 435, 433

[56] References Cited

U.S. PATENT DOCUMENTS

| | | | |
|---|---|---|---|
| 4,316,134 | 2/1982 | Balan et al. | 320/48 X |
| 4,626,765 | 12/1986 | Tanaka | 340/636 X |
| 4,876,632 | 10/1989 | Osterhout et al. | 340/636 X |
| 5,130,658 | 7/1992 | Bohmer | 340/636 X |

Primary Examiner—Jeffrey Hofsass
Attorney, Agent, or Firm—Nixon & Vanderhye

[57] ABSTRACT

A hand tool driven by a DC battery comprises a tool driving section having a motor, a DC source connected to the tool driving section, a plurality of LEDs connected to the DC source, an LED turning-off section for sequentially turning off the LEDs in accordance with the power remaining in the DC source, and an LED flickering section for causing flickering of at least one illuminated LED, when the driving section is overloaded.

8 Claims, 3 Drawing Sheets

HAND TOOL DRIVEN BY DC BATTERY WITH MULTIPLE LEVEL BATTERY CONDITION INDICATOR

BACKGROUND OF THE INVENTION

1. Field of the Invention

This invention relates to a portable hand tool using a DC battery and, more particularly, to a hand tool wherein not only the electric power remaining in the DC battery but also the overloaded operation state of the tool are displayed by LEDs located in a visual display section.

2. Description of the Related Art

A conventional portable hand tool driven by a DC battery comprises a battery checker which displays the power remaining in the DC battery. However, if overload occurs while the hand tool is being operated, this is not electrically detected and a cautionary indication is not be given to the user.

Thus, since the conventional hand tool does not have alarm means for informing the user that the tool is being operated in an overload state, the user may continue operating it, with the result that the tool will use up the battery power in a relatively short period of time, and also reduce the life of the tool parts.

SUMMARY OF THE INVENTION

An object of the present invention is to provide a hand tool wherein the power remaining in the DC battery is visually indicated by means of a plurality of LEDs and the user is informed that the tool is being operated in an overload state by flickering of the LEDs, thus making the tool more reliable, by reducing the loads applied to the parts thereof, so that they last longer than those of a conventional hand tool, which displays only power remaining in the DC battery.

This object is achieved by a hand tool comprising: tool driving means having a motor; a DC source connected to the tool driving means; a plurality of LEDs connected to the DC source; means for turning off, in sequence, the LEDs in accordance with the power remaining in the DC source; and flickering means for turning on and off at least one illuminated LED, causing it to flicker, when the tool driving means becomes overloaded while being operated.

When a new DC battery is loaded into the hand tool, all of the LEDs which are located in the handle are turned on. Since the voltage drops as the battery power is gradually consumed, the LEDs are turned off in sequence in accordance with the amount of power used, thereby indicating to the user the power remaining in the DC battery.

If excessive load is applied to the hand tool while it is being operated, the motor for driving the tool becomes overloaded. In such a situation, at least one of the illuminated LEDs is made to flicker so as to inform the user of the overload, in case it has not been noticed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

A belt grinder to which the present invention is applied will now be explained with reference to the drawings.

Figure 1:
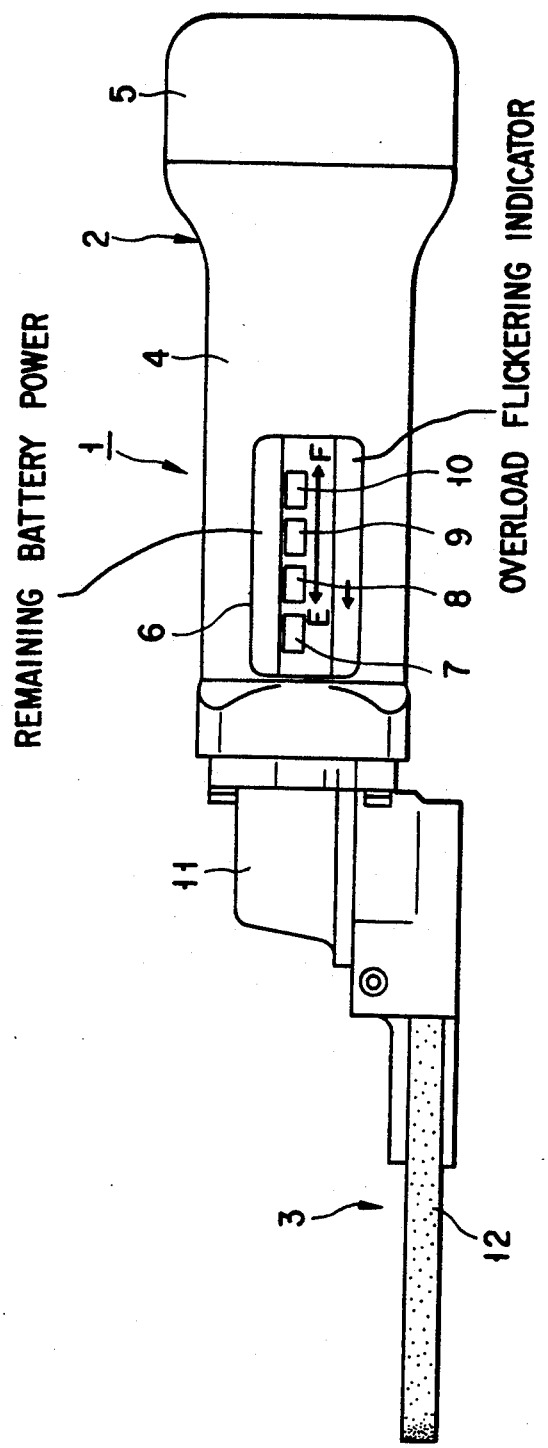
FIG. 1 is a plan view showing a hand tool according to an embodiment of the present invention.
Figure 2:
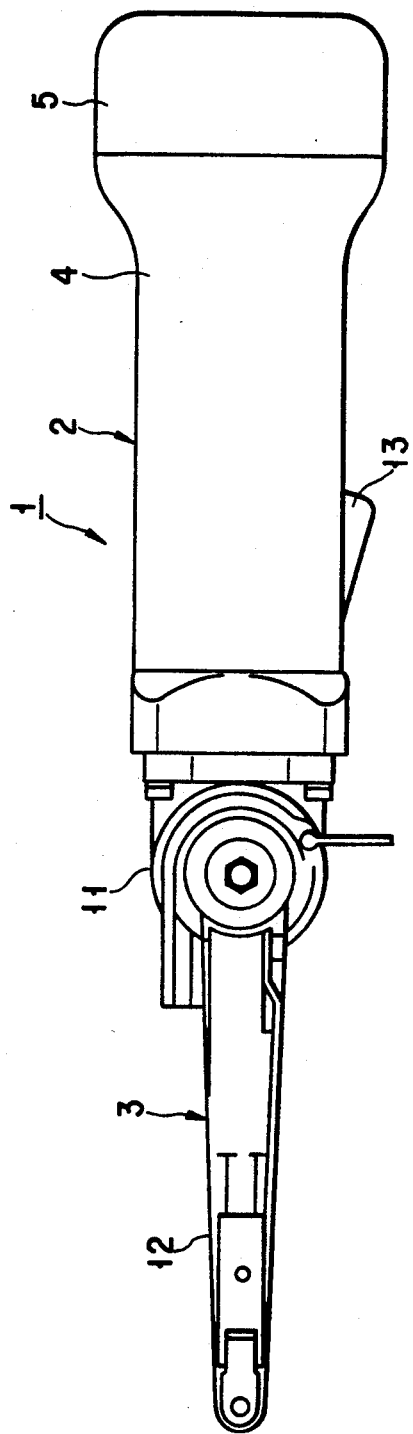
FIG. 2 is a side view showing the hand tool shown in FIG. 1.

FIG. 1 is a plan view showing a hand tool according to the present invention, and FIG. 2 is a side view thereof. A belt grinder 1 comprises a main body 2 and a grinding section 3. The main body 2 is constituted by a handle section 4 and a DC source section 5 attached thereto. In the DC source section 5, a DC battery BT, which can be electrically charged, is detachably mounted to the proximal end of the handle section 4.

Figure 3:
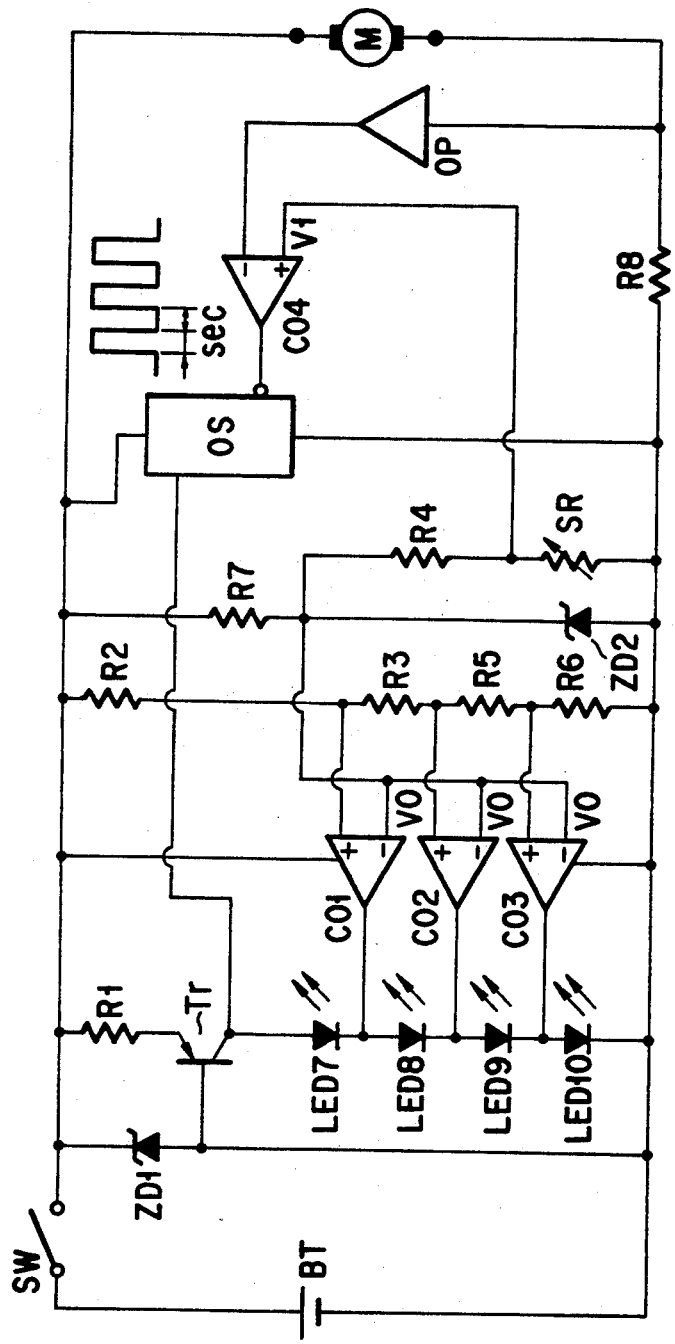
FIG. 3 is a diagram showing the circuit for driving the display section of the hand tool.

A display section 6 for displaying the remaining battery power and an overload state is formed in the handle section 4 and is constituted by four LEDs 7, 8, 9, and 10 arranged in a line in the longitudinal direction of the handle section 4 (See FIG. 3).

The main part of the grinding section 3 is a belt grinder portion 12 which is driven by means of a DC motor M (FIG. 3) provided in the handle section 4. A transfer portion 11 formed on the front portion of the handle section 4 transfers the rotational power of the DC motor M to the belt grinder portion 12. The belt grinder portion 12 is constituted by an endless grinding belt.

Reference numeral 13 in FIG. 2 denotes the switch (SW) for turning on the belt grinder 1.

The driving circuit in the display section 6 will now be described in detail, with reference to FIG. 3.

The driving circuit is constituted by a circuit for turning on the LEDs 7, 8, 9, and 10, a circuit for turning them off in sequence, and a circuit for causing to flicker them. As can be seen in FIG. 3, the driving circuit comprises a DC battery BT (in DC source 5), a switch SW (switch 13), Zener diodes ZD1 and ZD2, resistors R1, R2, R3, R4, R5, R6, R7, and R8, a PNP transistor Tr, light emitting diodes LED7, LED8, LED8, LED10, comparators CO1, CO2, CO3, and CO4, an operation, amplifier OP, an oscillator OS, and a variable resistor SR.

The LEDs 7, 8, 9, and 10 are turned on by different voltage values, depending on the relationship between the voltage produced by the resistor R7 and the Zener diode ZD2, and voltages produced by the resistors R6, R5, and R3. In other words, the voltages for turning on the LEDs 7, 8, 9, and 10 vary in four stages, governed by the resistors R3, R5, and R6. Hence, the LEDs are sequentially turned off in accordance with dropping of the voltage value due to consumption of the power in the DC battery BT.

When an excessive load is applied to the belt grinder portion 12, thereby increasing the resistance of the motor M and lowering the voltage divided by the resistor R8 and the motor M, the voltage at the output terminal of the comparator CO4 is higher than a reference voltage. As a result, the oscillator OS outputs a pulse signal of, for example, 1 Hz. If the pulse signal is HIGH, a collector current of the transistor Tr flows through the LEDs, whereas if the pulse signal is LOW, the collector current flows through the oscillator OS. Then, an LED which is ON is made to flicker in accordance with the frequency of the oscillation pulse of the oscillator OS.

The "remaining battery power display" operation and the "overload display" operation of the above embodiment will now be described.

Remaining battery power display operation

When the handle portion 4 is loaded with a new DC battery BT and the switch SW is moved to the ON-position, the transistor Tr is turned on, current flows through the LEDs 7, 8, 9, and 10.

At this time, the voltage applied to the positive input terminal of the comparator CO1 (the voltage divided by the resistors R3+R5+R6 and the resistor R2), the voltage applied to the positive input terminal of the comparator CO2 (the voltage divided by the resistors R2+R3 and the resistors R5+R6), and the voltage applied to the positive input terminal of the comparator CO3 (the voltage divided by the resistors R2+R3+R5 and the resistors R6) are all higher than the reference voltage $V_0$, which is applied to the negative input terminals of the comparators CO1, CO2, and CO3 and divided by the resistor R7 and the Zener diode ZD2. Hence, currents from the output terminals of the comparators CO1, CO2, and CO3 do not return to these comparators. As a result, the LEDs 7, 8, 9, and 10 are all turned on.

When the power in the DC battery BT begins to be consumed and the voltage begins to lower, the voltage applied to the positive input terminal of the comparator CO3 drops first, since the voltage drop due to the resistors R2, R3, and R5 is considerable. If the voltage applied to the positive input terminal of the comparator CO3 is lower than the reference voltage $V_0$ applied to the negative input terminal of the comparator CO3, the comparator CO3 is turned off. In this state, the current flows from the PNP transistor Tr through the LEDs 7, 8, and 9, the output terminal of the comparator CO3, and the negative input terminal thereof. Thus, since the current does not flow through the LED 10, the LED 10 is turned off.

As more power in the DC battery BT is consumed and the voltage is lowered further, the voltage applied to the positive input terminal of the comparator CO2 becomes lower than the reference voltage $V_0$ applied to the negative input terminal of the comparator CO2. In this state, the current flows from the LED8 through the output terminal of the comparator CO2 to the negative input terminal thereof, with the result that the LED 9 is turned off.

As the voltage continues to lower as further battery power is consumed, the LED 8 is turned off in the manner described above. When all of the LEDs except for LED 7 are turned off, this means that the power in the DC battery BT has been consumed to the limit of use.

Overload display operation

In a normal operating state, i.e., when the switch SW is in the ON-position and the motor M rotates, the voltage divided by the motor M and the resistor R8 is amplified by the amplifier OP to a predetermined value and input to the negative input terminal of the comparator CO4. The voltage is higher than a reference voltage $V_1$ which is applied to the positive input terminal of the comparator CO4 and is divided by the resistors R7+R4 and the variable resistor SR. Therefore, the comparator CO4 is in the OFF state and the oscillator OS does not oscillate.

If, during a grinding operation, an excessive load is applied to the belt grinder portion 12, the voltage applied to the negative input terminal of the comparator CO4 drops to lower than the reference voltage $V_1$ input to the positive input terminal of the comparator CO4, since the resistance of the motor M is increased and the voltage divided by the resistor R8 and the motor M is lowered. In such a case, the comparator CO4 is in the ON state, the output terminal of the comparator CO4 is HIGH and the oscillator OS oscillates a pulse signal of, for example, 1 Hz. When the pulse signal is HIGH, the collector current of the PNP transistor Tr flows toward LEDs. When the pulse signal is LOW, since the collector current of the transistor Tr flows toward the oscillator OS, all of the illuminated LEDs flicker in accordance with the frequency of the pulse generated by the oscillator OS. This flickering indicates to the user that the belt grinder portion 12 is operating in an overload state.

Although the above embodiment relates to a belt grinder, the present invention can be generally applied to any other type of hand tool driven by a DC battery, such as a disk grinder, a disk sander, and the like.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:
1. A hand tool including:
   a main body having a DC source;
   a tool section connected to the main body;
   a plurality of LEDs provided on the main body;
   a motor for driving the tool section;
   means electrically connected between the DC source and the plurality of LEDs, for turning on, in sequence, the LEDs in accordance with power remaining in the DC source; and
   flickering means electrically connected between the LEDs and the motor, and to the DC source, for turning on and off all of the LEDs when the motor is overloaded while in operation.

2. The hand tool according to claim 1 in which said turning-on means includes:
   means for connecting the LEDs to the DC source in a series relationship;
   a plurality of comparators, each comparator having an output terminal connected to an adjacent two LEDs and each comparator having first and second input terminals;
   a plurality of resistors connected across the DC source in a series relationship, each resistor connected between the first input terminals of two adjacent comparators, and resisting means connected across the DC source and commonly connected to the second input terminals of the comparators.

3. The hand tool according to claim 1 in which said flickering means includes:

means for oscillating a pulse signal, the pulse signal having two different levels when the motor is overloaded while in operation, and switching means connected between the oscillating means and the LEDs for receiving the pulse signal so that it selectively turns on the LEDs according to the levels of the received pulse.

4. The hand tool according to claim 1, wherein said flickering means includes:

means for connecting the LEDs to the DC source in a series relationship;

a plurality of comparators, each comparator having an output terminal connected to an adjacent two LEDs and each comparator having first and second input terminals;

a plurality of resistors connected across the DC source in a series relationship, each resistor connected between the first input terminals of two adjacent comparators, and resisting means connected across the DC source and commonly connected to the second input terminals of the comparators; and wherein said flickering means includes:

means for oscillating a pulse signal, the pulse signal having two different levels when the motor is overloaded while in operation, and switching means connected between the oscillating means and the LEDs for receiving the pulse signal so that it selectively turns on the LEDs according to the levels of the received pulse.

5. A hand tool including:

a main body having a DC source;

a tool section connected to the main body;

a plurality of LEDs provided on the main body;

a motor for driving the tool section;

first drive means for activating a number of the plurality of LEDs in accordance with a first monitored condition of the tool, the first monitored condition being power remaining in the DC source and the number of LEDs activated by the first drive means being related to a degree of power remaining in the DC source;

second drive means for flashing activation of the plurality of LEDs in accordance with a second monitored condition of the tool the second monitored condition being motor overload.

6. The hand tool according to claim 5, wherein the first drive means comprises a plurality of comparators which receive a power remaining reference signal.

7. The hand tool according to claim 5, wherein the second drive means comprises:

an overload comparator which compares a reference signal and a signal indicative of motor load, and which produces an overload signal as a result of the comparison during motor overload;

an oscillator which produces a bi-level output pulse signal upon receipt of the overload signal from the overload comparator; and switching means responsive to the bi-level output pulse signal for alternatingly turning the LEDs on and off.

8. The hand tool according to claim 7, wherein the switching means is a transistor, and wherein a collector current of the transistor flows to the LEDs during a first level of the bi-level output pulse signal and to the oscillator during a second level of the bi-level output pulse signal.

* * * * *